United States Patent [19]
Kempf

[11] Patent Number: 5,451,130
[45] Date of Patent: Sep. 19, 1995

[54] METHOD AND APPARATUS FOR THE STEP-BY-STEP AND AUTOMATIC LOADING AND UNLOADING OF A COATING APPARATUS

[75] Inventor: Stefan Kempf, Alzenau, Germany

[73] Assignee: Leybold Aktiengesellschaft, Hanau, Germany

[21] Appl. No.: 267,793

[22] Filed: Jun. 28, 1994

[30] Foreign Application Priority Data

Nov. 29, 1993 [DE] Germany ............... 43 40 522.3

[51] Int. Cl.⁶ ........................................... B65G 57/00
[52] U.S. Cl. ........................ 414/27; 414/217;
  414/225; 414/788.7; 414/788.8; 414/939;
  414/941; 198/346.2; 118/503; 118/730
[58] Field of Search ............. 118/503, 719, 721, 730;
  204/298.05, 298.15, 298.25, 298.26, 298.28,
  298.29; 198/341, 346.2, 464.2, 468.2, 468.4, 447,
  608, 614; 414/27, 217, 222, 225, 226, 788.7,
  788.8, 793, 797, 923, 939, 941

[56] References Cited

U.S. PATENT DOCUMENTS

| | | | |
|---|---|---|---|
| 4,143,776 | 3/1979 | Meyers et al. | 198/346.2 |
| 4,557,655 | 12/1985 | Berg | 414/27 |
| 4,735,540 | 4/1988 | Allen et al. | 414/222 |
| 4,886,592 | 12/1989 | Anderle et al. | 204/298 |
| 4,969,790 | 11/1990 | Petz et al. | 414/217 |
| 5,165,340 | 11/1992 | Karlyn et al. | 414/788.7 |
| 5,232,505 | 8/1993 | Novack et al. | 118/712 |
| 5,248,886 | 9/1993 | Asokawa et al. | 250/442.11 |

FOREIGN PATENT DOCUMENTS 219901 3/1985 Germany.
3507598 9/1986 Germany.

Primary Examiner—Joseph E. Valenza
Attorney, Agent, or Firm—Felfe & Lynch

[57] ABSTRACT

A first turntable (4) has a plurality of posts (6) equidistantly distributed and arranged in a circle on the turntable (4), wherein a plurality of substrates (7) can be stacked on each post (6). Stationary loading (9) and unloading stations (10 11) are provided and the distance between each pair of adjacent stations (9, 10, 11) corresponds to the distance between each pair of adjacent posts (6), the first turntable being rotated stepwise so that each post can be stopped successively at adjacent stations. A second turntable (12) is rotated stepwise through a loading station (15), a transfer station (16) and an unloading station (17). A loading arm transfers substrates from the loading station of the first turntable to the loading station of the second turntable, a transfer arm transfers the substrates from the transfer station to a coating station, and an unloading arm transfers coated substrates from the unloading station of the second turntable to either of the two unloading stations of the first turntable. A control system (33) includes a sensor (29), a counting device (30) and a servo motor (31), the servo motor (31) driving the unloading arm (21), the unloading station which receives a substrate being selected by the control system (33).

9 Claims, 11 Drawing Sheets

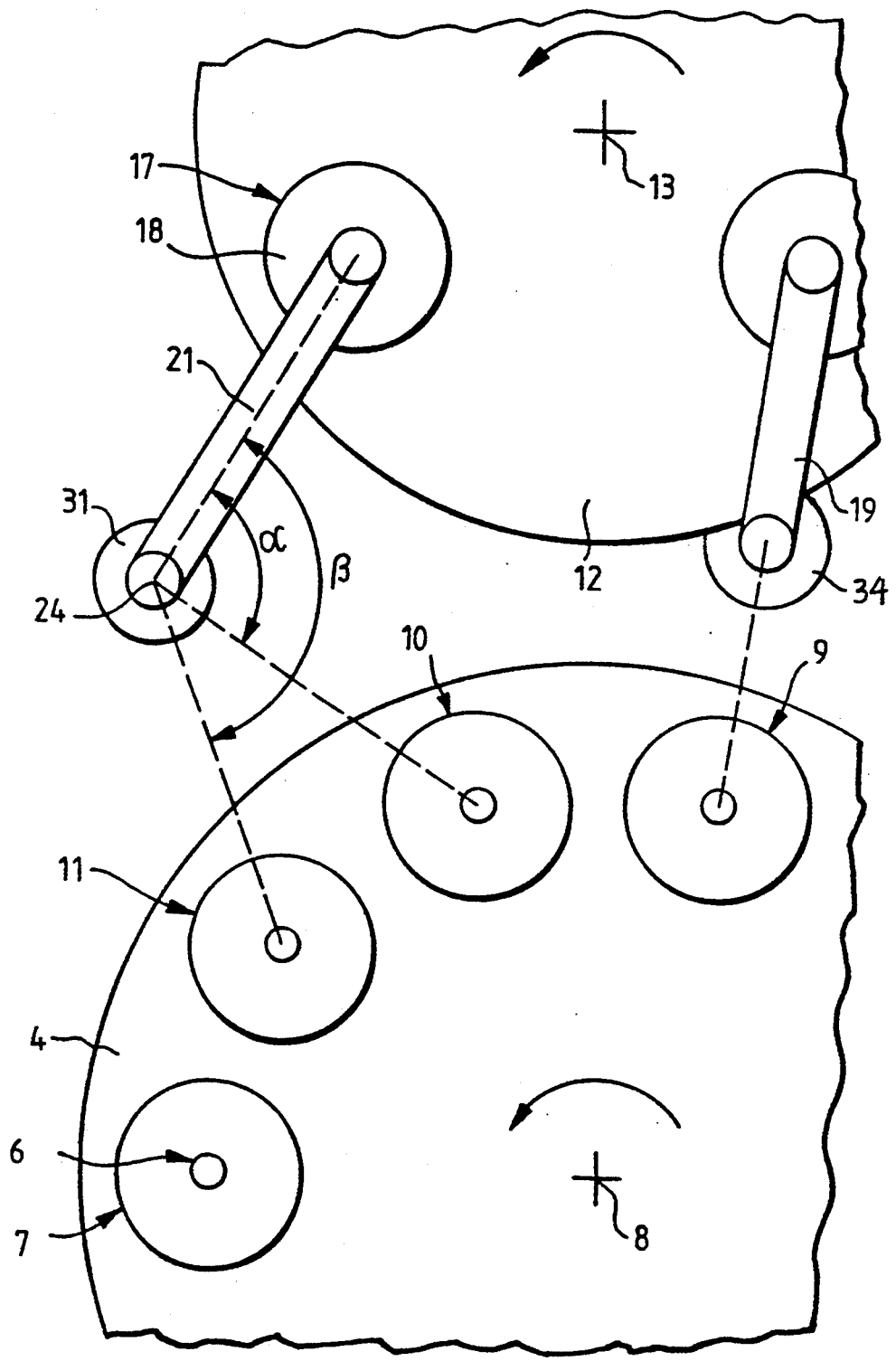

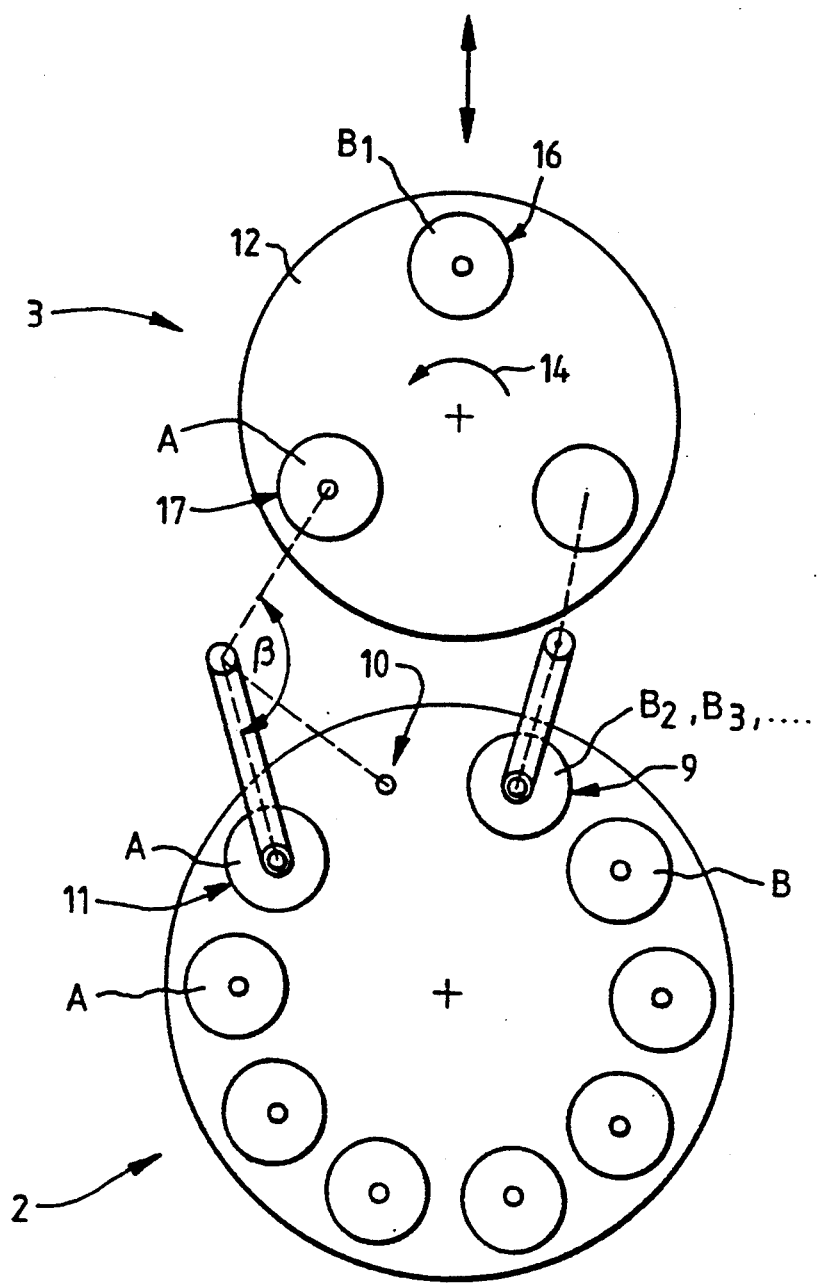

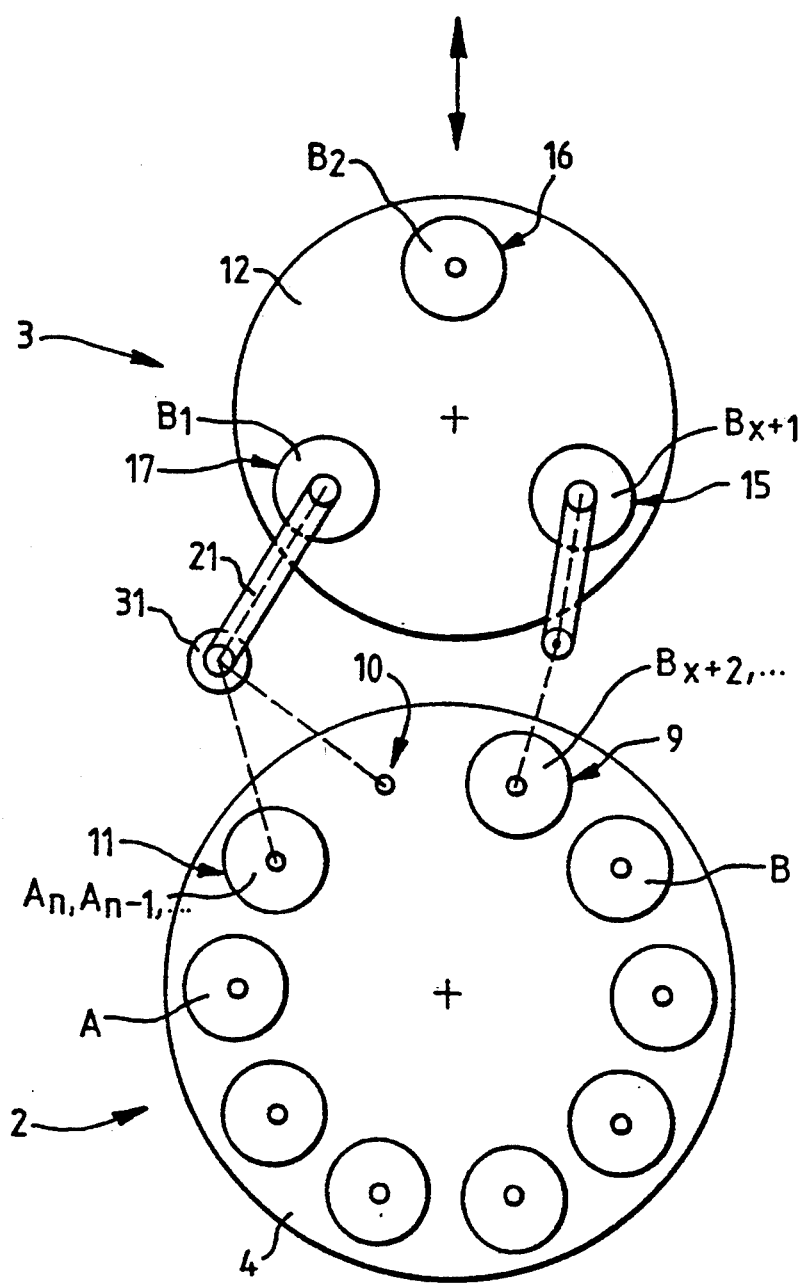

METHOD AND APPARATUS FOR THE STEP-BY-STEP AND AUTOMATIC LOADING AND UNLOADING OF A COATING APPARATUS

BACKGROUND OF THE INVENTION

The invention relates to an apparatus and method for stepwise automatic loading and unloading of a coating apparatus with disk-shaped substrates, especially for data storage technology. This apparatus consists essentially of a magazine with a first turntable on which a plurality of posts are disposed for receiving the substrates.

The substrates to be coated are admitted through an airlock individually into a vacuum chamber by means of a transfer system, and after coating they are again deposited onto a holding post by the transfer system.

The operation of such an apparatus can be considered to be quasi-continuous on account of the stop that occurs between the individual stages for the entry and exit actions, and due to the stationary coating procedure.

U.S. Pat. No. 4,886,592 describes an apparatus based on the carousel principle for the coating of substrates. In this case a rotatable substrate holder is disposed in a vacuum chamber, and on it a plurality of substrate holding posts are provided. A corresponding number of substrates can be transported stepwise on a circular path from one airlock station successively through at least one coating station to the other airlock station by means of a drive. The stepping width of the drive on the one hand, and on the other hand the angular attitude of each coating station to the airlock station associated with it with respect to the axis of rotation of the substrate holder, are selected such that one and the same coating station is associated by the stepping movement with a specific substrate post and the same airlock station.

In the operation of such apparatus, the so-called loading stations by which an automatic loading and unloading of such apparatus is possible are important. Such loading stations in connection with the corresponding magazines are comparatively expensive and complicated, and their cycling frequency is of great economical importance to the economical operation of the coating apparatus, for example for the production of Compact Disks, referred to hereinafter as CD's.

In the state of the art, therefore, loading and unloading apparatus are known which provide the substrate magazine with two turntables, and which therefore occupy a large amount of space.

On the other hand there is a problem in the fact that the transfer arms of the transfer system pick up a substrate from a magazine and transfer it to the coating apparatus, and simultaneously a second transfer arm returns a substrate from the coating apparatus to another magazine. Thus each of these two transfer arms can serve only two stations, namely a magazine loading station and a magazine unloading station. As soon as all the substrates have been taken from the post that is situated at the loading station, the turntable is usually rotated to another station, so that the unloaded post is then removed by hand and placed upon the unloading station of the other turntable. Then this post is again loaded with substrates which return from the coating apparatus.

Since not only CD's but also the titles identifying them are processed on one and the same coating apparatus, the machine is idle when changing from one title A to a title B; as soon as the last CD with title A has been removed from the turntable of the magazine, usually the coating apparatus is at first "run empty." Otherwise the CD's of different titles A and B returning from the coating apparatus to the magazine would be deposited on one and the same post.

SUMMARY OF THE INVENTION

The apparatus according to the invention on the one hand assures a high throughput of substrates without human intervention over a long machine running time, while on the other hand the space occupied by the entire installation is as small as possible. The continuous treatment of different CD labels is possible without substantially increasing the investment cost.

An apparatus for the step-by-step, automatic loading and unloading of a coating apparatus with disk-shaped substrates, especially for data storage technology, consists essentially of a magazine having a first turntable which can rotate about a fixed axis, and a plurality of posts disposed on the turntable at equal distances apart and in a circular arrangement. At the same time a plurality of substrates can be stacked on each individual post, and fixed loading and unloading stations are provided for the magazine. This apparatus consists furthermore of a transfer system having a second turntable which can rotate step-by-step about a fixed axis and has at least three stations to accommodate one substrate each, and it has at least three transfer arms which correspond each to one station of the second turntable. The loading arm picks up one substrate from the post that is then located at the loading station of the magazine and deposits the substrate at the loading station of the transfer system, and the unloading arm simultaneously picks up a substrate from the unloading station of the transfer system and places it back on one of two possible posts which are then situated on the two unloading stations of the magazine. Essential to the invention is a control system which consists especially of a sensor, a counting device and a servo motor, the servo motor driving the unloading arm and the post of the magazine that is to be loaded can be predetermined by the control system.

The above-described apparatus occupies substantially less space than the former version with a magazine consisting of two turntables. The important advantage of the invention here described, however, is that the apparatus can be loaded with different substrates, such as CD's of titles A and B, and that they can be treated continuously by the coating apparatus and returned to the magazine, without requiring a machine idle cycle, and that the empty posts are automatically transported from the loading station to the unloading station.

BRIEF DESCRIPTION OF THE DRAWING

FIG. 2 is an enlarged detail from FIG. 1, especially the unloading station, and

FIGS. 3A to 3I show a sequential loading and unloading procedure with different substrates A and B.

DETAILED DESCRIPTION OF THE PREFERRED EMBODIMENT

Figure 1:
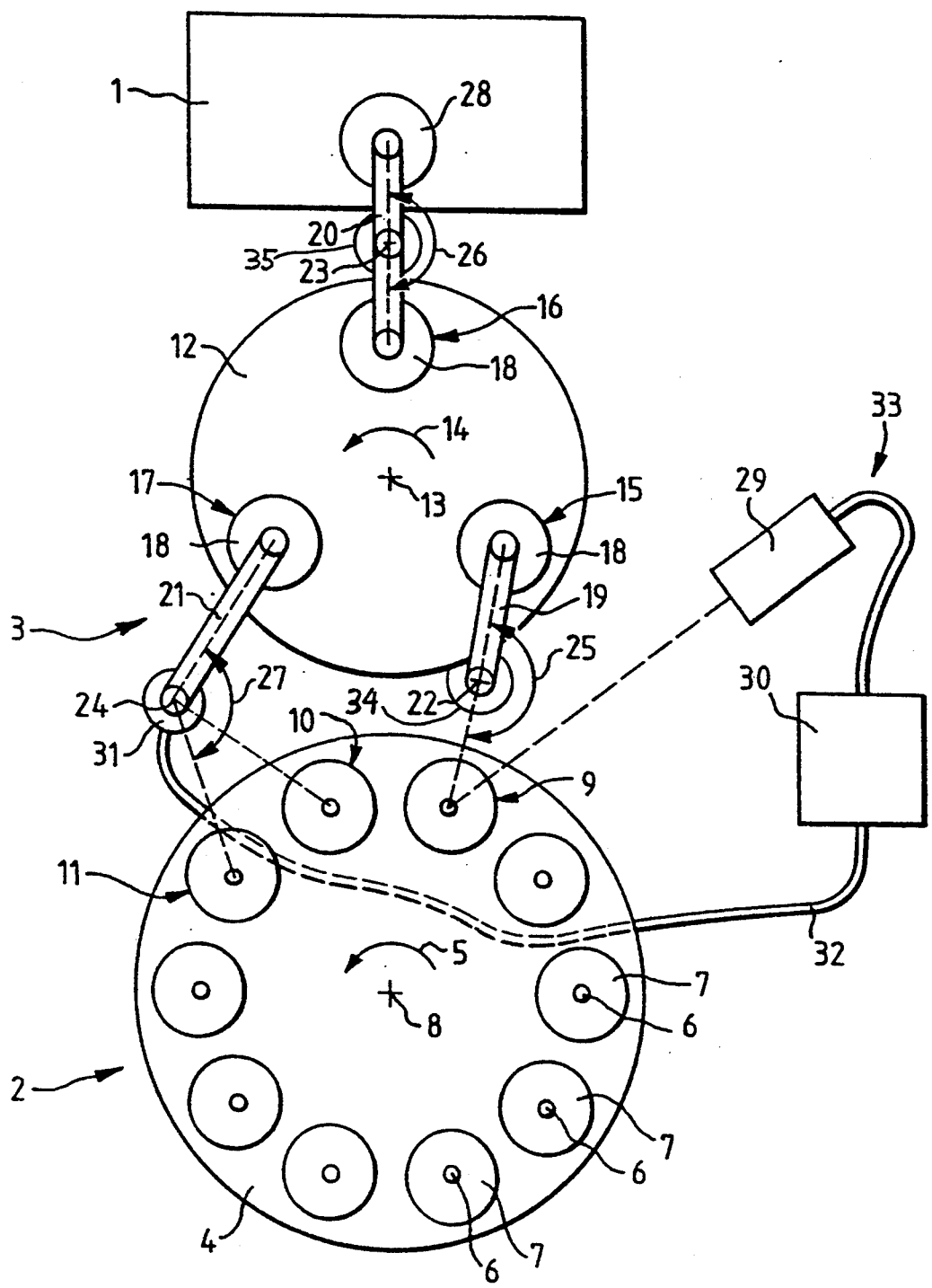
FIG. 1 is a schematic representation of a top plan view of the apparatus of the invention.

The apparatus of the invention (FIG. 1) can be divided into three essential component assemblies; the coating apparatus 1, the magazine 2, and the transfer system 3. The magazine 2 consists of a first turntable 4 of circular shape which can turn about the axis 8 in sense 5. On the turntable a plurality of posts 6 are arranged in a circle and at equal intervals. The main axes of these posts 6 are perpendicular to the surface of the turntable 4. The circular substrates 7 to be treated have a central hole and are thus stacked in groups of several substrates on a post 6.

At the point at which the magazine 2 is nearest the transfer system, fixed stations for the magazine 2 are established. These stations are a loading station 9, a first unloading station 10, and a second unloading station 11. The intervals between two adjacent stations correspond precisely to the distance between adjacent posts. Consequently, each post 6 can be moved by the step-by-step rotation of the turntable 4 past the three fixed stations 9, 10 and 11.

The transfer system 3 consists essentially of a second turntable 12 which rotates around the axis 13 in sense 14. On the turntable 12, in contrast to turntable 4 of the magazine 2, three equidistant recesses are provided, which move with the turntable 12 about the axis 13. These shall be referred to herein as loading station 15, transfer station 16 and unloading station 17. The terms loading and unloading are used in relation the coating apparatus 1.

The path of a substrate 7 from the magazine 2 to the coating apparatus 1 and back again to magazine 2 is as follows: A substrate is picked up by the loading arm 19 at the loading station 9 of magazine 2, and carried to the transfer system 3 and there deposited at the loading station 15. The substrate 18 is carried by the rotation of turntable 12 to the transfer station 16. From there a transfer arm 20 picks up the substrate 18 and puts it into the coating apparatus 1. The substrate 28 is then carried through a plurality of stations within the coating apparatus 1, which, for the sake of simplicity, are not represented. The coated substrate is then picked up again by the transfer arm 20 and returned to the transfer station 16. The step-by-step rotation of turntable 12 in sense 14 now carries the substrate to the unloading station 17 of the transfer system 3. There an unloading arm 21 takes over the substrate 18 and then deposits it on one of the two posts of magazine 2 which are just then at the unloading stations 10 and 11. The unloading of magazine 2, like its loading, is performed by another apparatus or also by the operator.

The loading arm 19 is journaled at one end on the pivot axis 22 and swings along arc 25. The transfer arm 20 is journaled at the center of the axis 23 and performs a 180° swinging movement. The unloading arm 21 has at its one end a pivot axis 24 about which it swings along arc 27.

The control system 33 consists of a sensor 29, e.g., an optical sensor, which is aimed at the post of the loading station 9 of magazine 2. This sensor 29 registers when all of the substrates 6 have been removed from this post or when a post loaded with substrates 7 has arrived at the loading station 9. The signals of the sensor 29 are fed into a counter 30 and transmitted from there through a control cable 32 to the servo motor 31. Servo motor 31 is provided so as to drive the unloading arm 21 of the transfer system 3, and a servo motor 34 is provided to drive the loading arm 19. A servo motor 35 is provided to drive the transfer arm 20.

The unloading arm 21 (FIG. 2) pivots at its one end about the axis 24. For the other end of the unloading arm 21, there are three fixed stopping points: one is the unloading station 17 on the turntable 12 of the transfer system 3, the others are the unloading station 10 and the unloading station 11 of the magazine 2. Between the stopping points 17 and 10 there is an angle $\alpha$, which is approximately a right angle. Between stopping points 17 and 11 an angle $\beta$ is defined, which is larger than the angle $\alpha$.

The path of different substrates of types A and B through the loading and unloading apparatus, as well as the movements of transfer arms 19 and 21 necessary for that purpose are represented step-by-step in the following FIGS. 3A to 3I. The identification of the substrates here is alphanumerical so as to represent more clearly the switching from the type A substrates to type B within the apparatus. The index following the letter gives the numeral of the substrate of the particular type, beginning 1, 2, 3 . . . , continuing with x, x+1, . . . , and ending at n−1 and n. The directions of the arrows BL and EL indicate the directions in which the coating apparatus is loaded and unloaded.

The last substrate $A_n$ (FIG. 3A) of type A is at the loading station 9 of the first turntable 4, the second-last substrate $A_{n-1}$ is at the loading station 15 of the second turntable 12. Likewise, at all of the rest of the stations 16, 10, 11 that follow in the direction of substrate movement there are still substrates of type A. Substrates of type B are stacked on the posts that are ahead of the loading station 9 of magazine 2 in the direction of rotation 5.

Figure 3A:
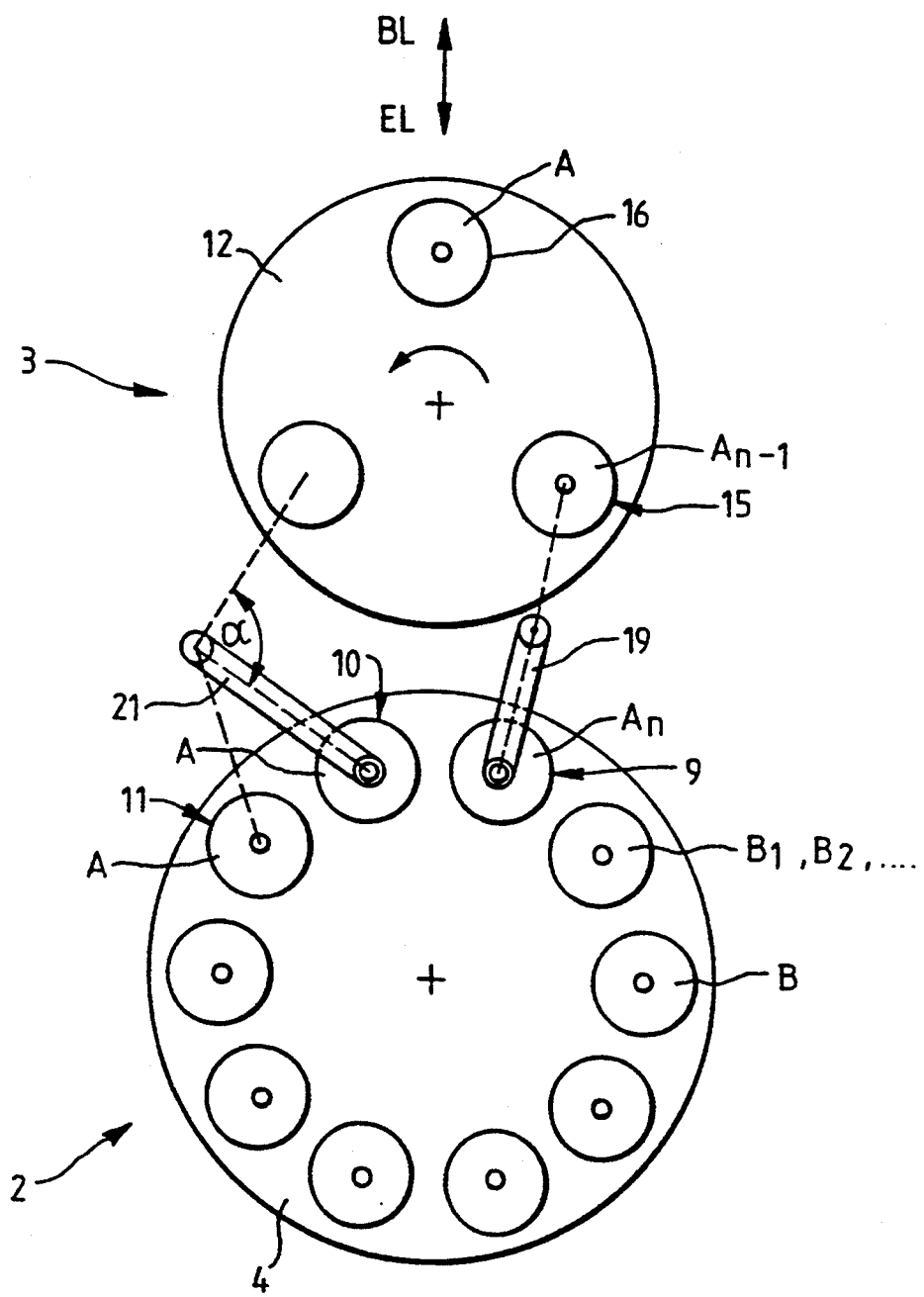
Figure 3B:
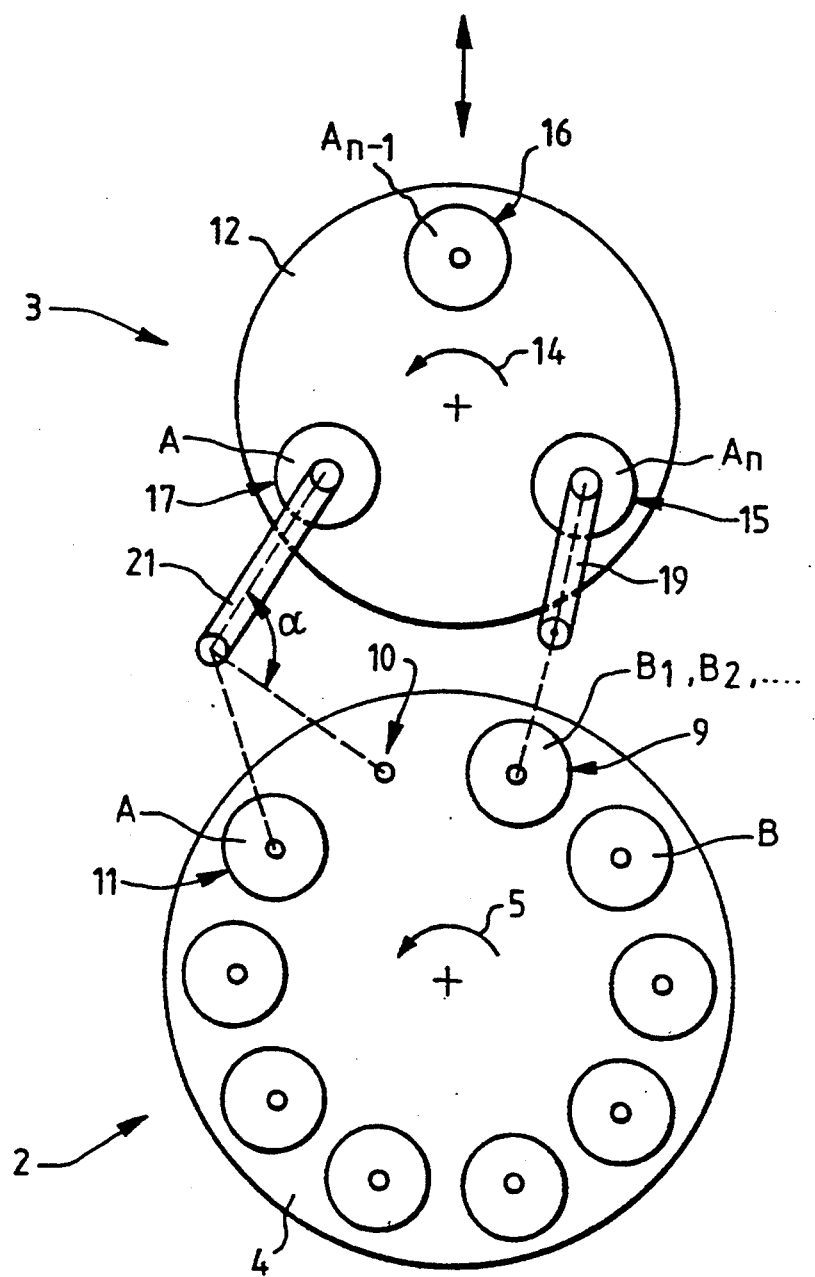
Figure 3C:
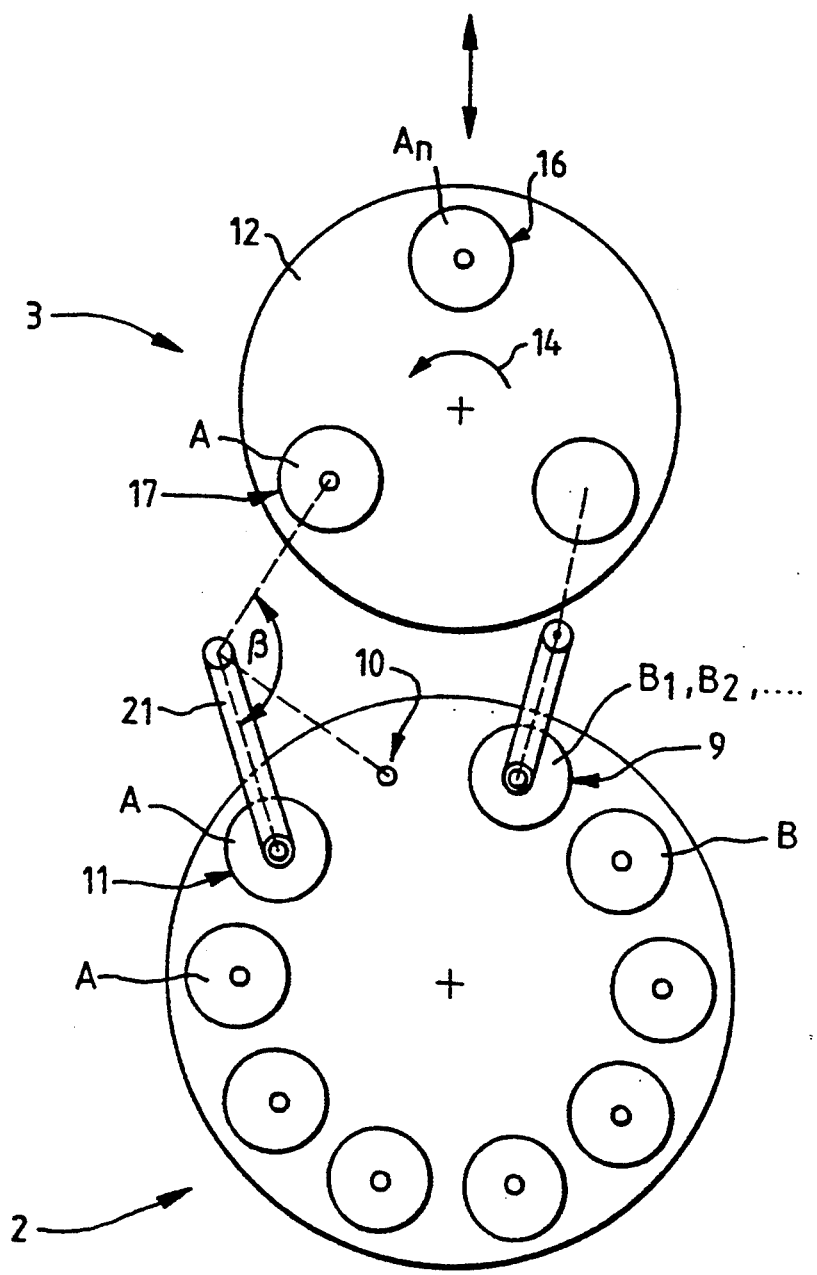

After the last substrate $A_n$ has been removed from the magazine 2, the turntable 4 is rotated one position further (FIG. 3B). The post from which the last substrate $A_n$ was removed is now at the unloading station 10 of magazine 2. The stack of the first substrates of type B has now arrived at the loading station 9 of the magazine 2. The last substrate $A_n$ is now at the loading station 15 of the transfer system 3. The unloading arm 21 has until now moved substrates over the angle $\alpha$ and placed them on the post that was up to now at the unloading station 10 of the magazine 2. This post is now at the unloading station 11, and the turntable 12 is rotated so that the last substrate $A_n$ is at the transfer station 16 (FIG. 3C). The unloading arm 21 now sweeps over the angle $\beta$, so that all of the other substrates of type A are stacked at the unloading station 11 of the magazine 2.

Figure 3D:
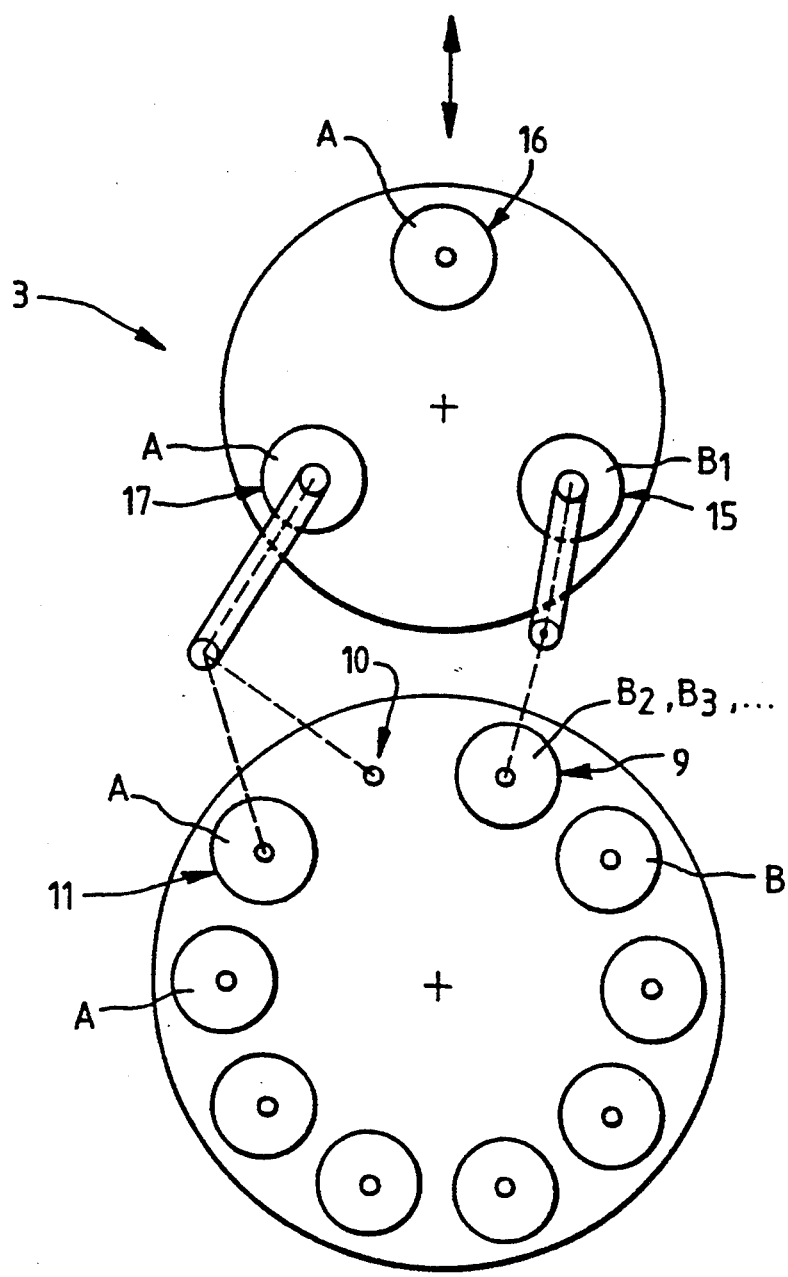
Figure 3F:
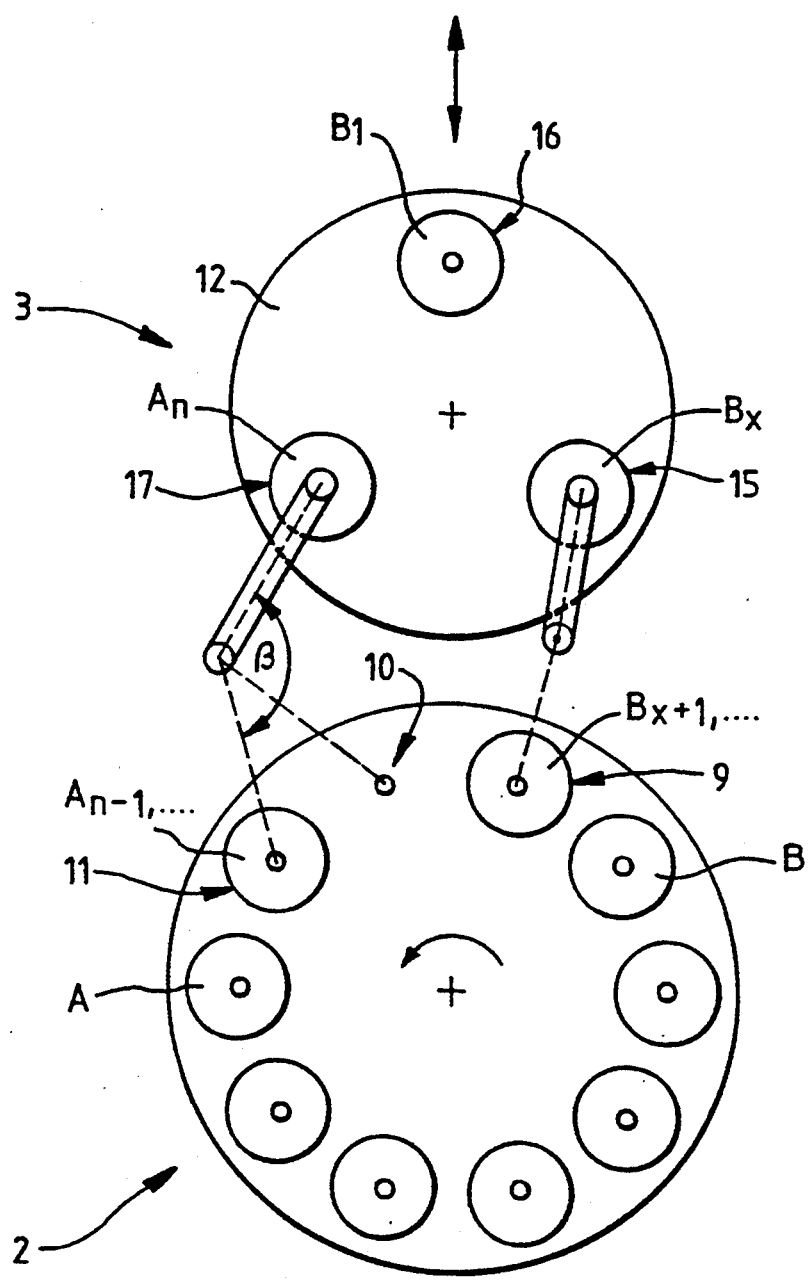

In the step illustrated by FIG. 3D, the first substrate $B_1$ of type B is deposited on the loading station 15 of the transfer system 3.

After another turn of the second turntable 12 (FIG. 3E), the substrate $B_1$ is at the transfer station 16 of the transfer system 3. Additional substrates of type A are carried from the unloading station 17 of the transfer system 3 across the angle $\beta$ to the unloading station 11 of the magazine 2.

After the substrate $B_1$ has returned from the coating apparatus (FIG. 3F), it is set down again at the transfer station 16 of the turntable 12. A succeeding substrate $B_x$ is situated in the meantime at the loading station 15, while the last substrate $A_n$ of type A has arrived at the unloading station 17 of the transfer system 3. The second-last substrate $A_{n-1}$ lies on top of the substrate stack that is situated at the unloading station 11 of the magazine 2.

Figure 3G:
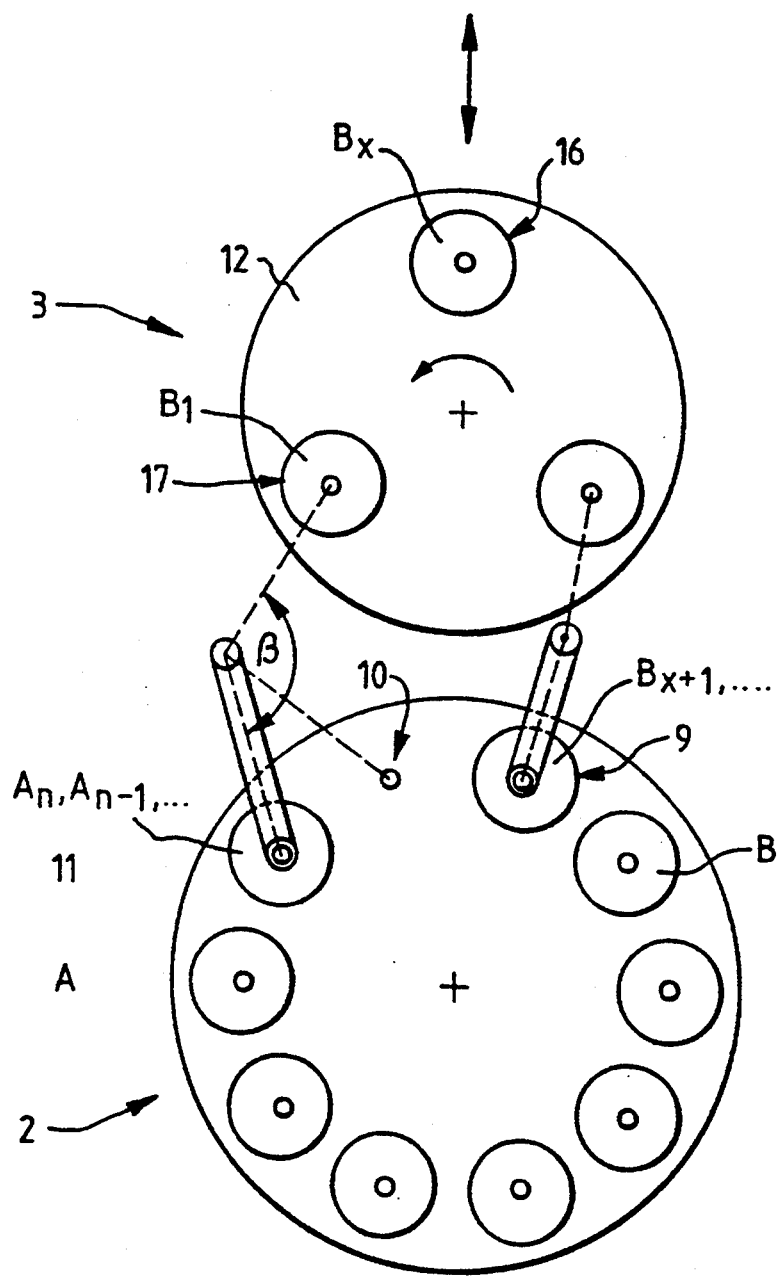
Figure 3I:
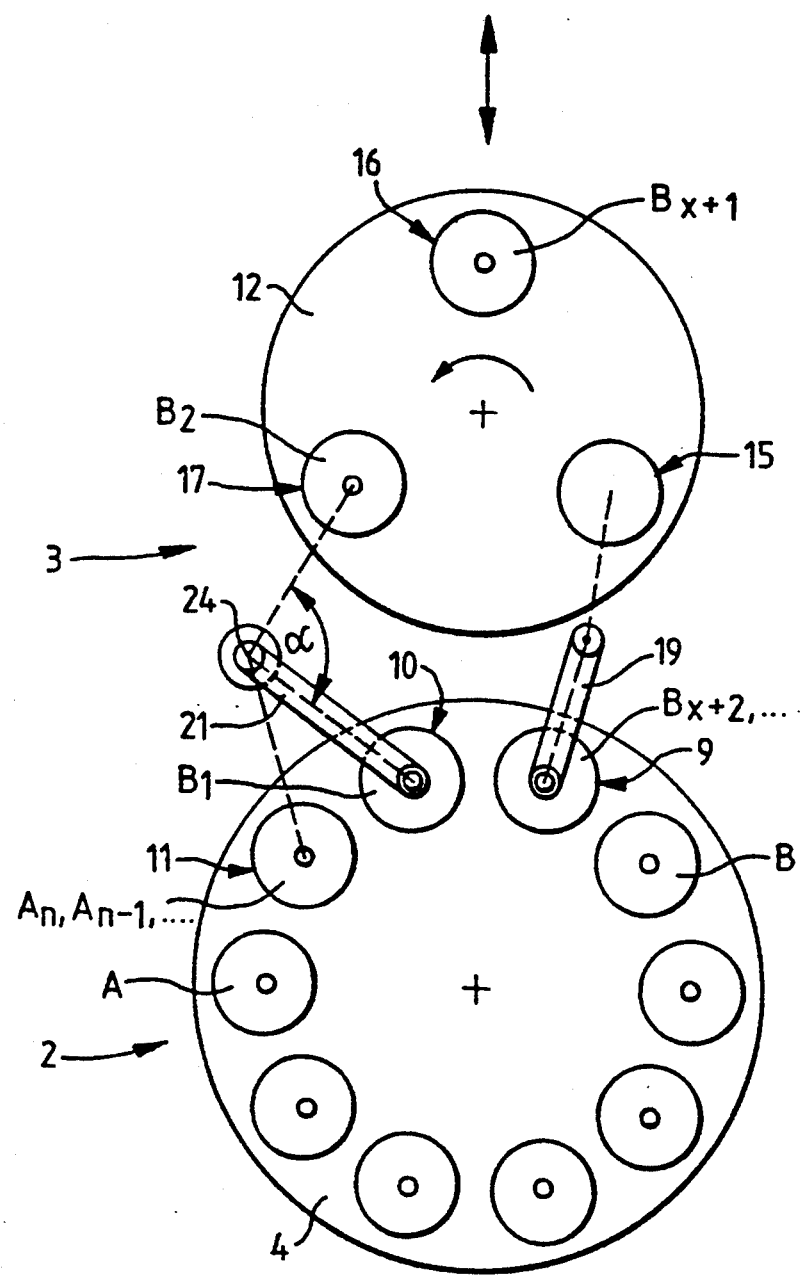

The last substrate $A_n$ is then returned over the angle $\beta$ to the unloading station 11 of the magazine 2 (FIG. 3G). The first substrate $B_1$ has now arrived at the unloading station 17 of the transfer system 3, so that substrates of type B are at all stations of turntable 12 and on the stations ahead of it in the direction of transfer.

In FIG. 3H the position of the turntable 4 of magazine 2 is still unchanged from that shown in 3B, so that the post that is at the unloading station 10 is still empty. The turntable 12 of the transfer system 3, however, has meantime rotated several stations further on. After the unloading arm 21 has picked up the first substrate $B_1$ of type B, the servo motor 31 receives another signal from the counting meter 30 (FIG. 1).

While the loading arm 19 (FIG. 3I) is feeding type B substrates one after the other from the loading station 9 of magazine 2 to the loading station 15 of the transfer system 3, the unloading arm 21 carries the first type B substrate $B_1$ to the unloading station 10 of the magazine 2. Now the unloading arm 21 sweeps over the angle $\alpha$. Thus, substrates of type A are at the unloading station 11 of the magazine 2 and on all of the posts ahead of this station in the direction of transport. At the unloading station 10 of magazine 2 and all of the posts that follow in the direction of transport, substrates of type B are now present. Thus, a clear segregation of type A and B substrates on the turntable 4 of magazine 2 is assured also after the different substrates A and B have been coated.

The operation of the control system will now be described in further detail. The sensor 29 generates a signal when there are no longer any substrates at the loading station 9. A counter 30 then causes the first turntable to rotate one step so that a new batch of substrates arrive at the loading station, and further causes the unloading arm to move through a second angle $\beta$ so that the second loading station 11 receives the coated substrates. After each swinging movement through angle $\beta$, the second turntable is rotated to move a coated substrate to the loading station 17, as shown in FIGS. 3C, 3E, and 3G. The number of swinging movements through angle $\beta$ is predetermined by the number of substrates on the second turntable when the loading station 9 was empty. When the predetermined number has been done, the counter 30 causes the unloading arm 21 to swing through a first angle $\alpha$, so that the coated substrates which follow are placed at the first loading station 10. See FIG. 3I.

The foregoing is exemplary and not intended to limit the scope of the claims which follow.

I claim:

1. Apparatus for transferring disk-shaped substrates to and from a coating station, said apparatus comprising
    a first turntable having a plurality of posts equidistantly distributed and arranged in a circle on the first turntable so that a plurality of disk-shaped substrates can be arranged on each post, said first turntable being rotatable stepwise about a fixed axis so that each post can be stopped successively at a loading station, a first unloading station, and a second unloading station, the distance between stations being a multiple of the distance between posts,
    a second turntable having a plurality of posts equidistantly distributed and arranged in a circle on the second turntable so that a plurality of disk-shaped substrates can be arranged on each post, said second turntable being rotatable stepwise about a fixed axis so that each post can be stopped successively at a loading station, a transfer station, and an unloading station, the distance between stations being a multiple of the distance between posts,
    a loading arm arranged to pick up a substrate at the loading station of the first turntable, rotate through an angle, and put down the substrate at the loading station of the second turntable,
    a transfer arm arranged to pick up a substrate at the transfer station of the second turntable, rotate through an angle, put down the substrate at a coating station, pick up the substrate at the coating station, rotate through an angle, and put down the substrate at the transfer station,
    an unloading arm arranged to pick up a substrate at the unloading station of the second turntable, rotate through one of a first and second angle, and put down the substrate at one of the first and second unloading stations of the first turntable, and
    a sensor which monitors the loading station of the first turntable and generates a signal when there are no more substrates present at the loading station of the first turntable, and
    a counter which controls the stepwise rotation of the first turntable and the angle through which the unloading arm rotates in response to the signal from the sensor.

2. Apparatus as in claim 1 wherein said counter causes said first turntable to rotate stepwise when said signal is generated.

3. Apparatus as in claim 2 wherein said counter causes said unloading arm to rotate through said second angle from said unloading station of said second turntable to said second unloading station of said first turntable a predetermined number of times after said signal is generated, each rotation from said unloading station of said second turntable to said unloading station of said first turntable being followed by a stepwise rotation of said second turntable.

4. Apparatus as in claim 3 wherein after said unloading arm has been rotated through said second angle to said second unloading station a predetermined number of times, said counter causes said unloading arm to move through said first angle from said unloading station of said second turntable to said first unloading station of said first turntable.

5. Apparatus as in claim 1 wherein said stations of said first turntable are arranged a single step apart, whereby each stepwise rotation of said first turntable moves a post from one of said stations to the next successive station.

6. Apparatus as in claim 1 wherein said stations of said second turntable consist of said loading station, said transfer station, and said unloading station, said stations of said second turntable being spaced 120° relative to the axis of said second turntable.

7. Apparatus as in claim 1 wherein the first and second turntables are rotated stepwise at respective first and second frequencies, said second frequency being a multiple of said first frequency.

8. Apparatus as in claim 1 wherein said first and second turntables are disposed in a horizontal plane.

9. Apparatus as in claim 1 wherein said second angle through which said unloading arm is rotated to said second unloading station is larger than said first angle through which said unloading arm is rotated to said first unloading station.

* * * * *